United States Patent [19]

Landt et al.

[11] 4,311,972

[45] Jan. 19, 1982

[54] HIGH SPEED ANTENNA COUPLER

[75] Inventors: Harvey L. Landt; Donald J. Mooty, both of Cedar Rapids, Iowa

[73] Assignee: Rockwell International Corporation, El Segundo, Calif.

[21] Appl. No.: 113,982

[22] Filed: Jan. 21, 1980

[51] Int. Cl.³ .............................................. H03H 7/40
[52] U.S. Cl. .................................. 333/17 M; 333/263; 455/125
[58] Field of Search ............... 333/17 M, 32; 455/120, 455/121, 123, 124, 125

[56] References Cited

U.S. PATENT DOCUMENTS

| | | | |
|---|---|---|---|
| 2,456,800 | 12/1948 | Taylor et al. | 333/17 M |
| 3,265,994 | 8/1966 | Bruene et al. | 333/17 M |
| 3,617,953 | 11/1971 | Kingma et al. | 333/17 M |
| 4,209,758 | 6/1980 | Snedkerud et al. | 333/17 M |

Primary Examiner—Paul L. Gensler
Attorney, Agent, or Firm—Richard K. Robinson; Howard R. Greenberg; H. Fredrick Hamann

[57] ABSTRACT

An antenna coupler samples the power transferred between the transmitter and the load, and at two equal distance points from the load. The coupler, based upon the value of the samples, connects a tuning stub to the transmission lines that ensures matched impedance conditions between the transmitter and the load.

6 Claims, 3 Drawing Figures

4,311,972

HIGH SPEED ANTENNA COUPLER

BACKGROUND OF THE INVENTION

This invention relates to radio frequency antenna couplers and in particular to very high frequency antenna couplers.

To ensure maximum power transfer between a power source and a load, as is known in the art, the impedance of the transmission line between the power source and the load must be equal to the output impedance $Z_0$ of the load. The impedance of the transmission line and the load is not a constant impedance and there are many variables which will drastically affect the characteristic impedance of the transmission line and the load. Examples of these variables are the frequency of the signal that is being applied to the transmission line and the load, environmental conditions, loose manufacturing tolerance of the transmission line and the load, and combinations of the above enumerated conditions. In situations where there is a very high frequency signal, such as that generated by a radio transmitter and in particular a very high frequency transmitter; the above enumerated conditions can drastically effect the operation of a transmitter and the transfer of power between the radio frequency source and the load which is normally an antenna. To deal with this situation in the prior art, tuning stubs are used to place in parallel with the transmission line and load a parallel resistance component that matches the load to the output impedance of the radio frequency source. The tuning stub is then adjusted, through its location on the transmission line, to cancel out the residual reactance at the tuning location point. If the stub is connected behind a voltage maximum, the tuning stub is short circuited and will not exceed a quarter-wavelength, $\lambda/4$, at the operating frequency. The tuning stub must be repositioned and adjusted for each new frequency selected by the radio frequency source and for any change in the environmental conditions.

An impedance matching network which can also be described as a lumped element tuning stub for matching a generator to a load over a wide range of frequencies and impedances was disclosed in U.S. Pat. No. 4,095,198. The network provided a pair of buses having a plurality of capacitors that can be selectively connected to achieve an overall desired value of capacitance, and a second pair of buses across which a plurality of inductors may be selectively connected to achieve an overall desired value of impedance for the network. The network can be controlled so that the capacitance and inductance elements may be arranged with respect to each other, the generator and load in any one of four possible L type configurations. The above described network provides a means for selectively tuning a transmission line to achieve a desired impedance matching tuning stub or filter. However, there was no provisions provided for dynamically matching the impedance to be detected condition.

In a similar type circuit disclosed in U.S. Pat. No. 3,775,707 there was disclosed an improved antenna coupler having reactive elements for translating antenna impedance to a resistive load, and an auto transformer for transforming the resistance load into a resistive level for matching with the resistance of the RF source. The auto transformer included a magnetic core and a coil having a plurality of turns, tap contacts to select turns of the coil and a switch means for connecting one of the taps of the coil to the antenna and on the other side for connecting one of another set of taps to an inductive means. Here again impedance matching was provided but there was no means for determining the desired impedance.

In U.S. Pat. No. 3,906,405 there was disclosed a tunable antenna coupling circuit for applying signals of different frequencies between an antenna and a transmitter-receiver and included a series circuit having a plurality of inductance sections and one or more shunt circuits providing capacitance between the series circuit and a reference potential. Switches are connected across the inductance sections and selectively connect the capacitors in the shunt circuits to control the effective values in the circuit to match the impedance of the antenna at different frequencies and to efficiently appy signals between the antenna and the transmitter-receiver. The switches are controlled by the channel selector and provide for different channel frequencies to be coupled to the switches through a diode matrix for selectively operating the reed switches. The position of the channel selector controls the operation of a preselected number of the switches to provide the desired coupling impedance for each channel. The value of the inductance sections and the value of the capacitance have a binary relation so that by selective connection in the coupling arrangement a wide range of impedance values and capacitance values are obtained in small incremental steps. The above enumerated patent tied the antenna coupler to the frequency of operation but did not provide for the situations where environmental conditions also influence the impedance of the transmission line and antenna in addition to the frequency of operation of the radio.

Another means for ensuring the proper power transfer between a radio transmitter and the antenna was provided for in U.S. Pat. No. 3,366,883 which provided a control device that controlled the flow of power from the radio frequency source to the antenna. Interposed between the radio frequency source and the antenna system was a voltage control attenuator which attenuated the voltage in response to a sense signal that was the summation of the measured forward power and reflected power. The flow of power was thus regulated as a function of the forward power to a given value for matched conditions and is reduced as a function of the amount of mismatch indicated by the presence of the reflected power from the load.

SUMMARY OF THE INVENTION

An antenna coupler samples the power transferred between the transmitter and the load and at two equal distance points from the load. The coupler, based upon the value of the samples, connects a tuning stub to the transmission lines that ensures matched impedance conditions between the transmitter and the load.

The antenna coupler provides for tuning the transmission line between the radio frequency source that has an output impedance $Z_0$ and the radio frequency (RF) load such as an antenna by measuring the power transferred between the radio and the RF load at a point located at a preselected distance $a$ from the RF load, measuring the power transferred between a point located at a distance of $2a$ from the RF load, and inserting a tuning stub having a length $\Psi$ located at a distance $\phi$ from the RF load whereby $\Psi$ and $\phi$ are determined by the power transferred between the two equal distance points of the load and the output impedance of the radio frequency source. The antenna coupler can be tuned for any antenna impedance at an extremely fast rate such as 5 microseconds when high speed digital logic is used to build the coupler. The selection of the tuning stub length and tap point is accomplished by the forward biasing of only two switching diodes such as pin diodes. This results in a small size coupler and because of the characteristics of the circuit, the pin diode's capacitance is effectively absorbed by the transmission line configuration. The coupler is operable to very high RF power application of approximately 100 watts or greater and is limited only by the type of pin diodes employed and the characteristics of the antenna. The tuning of the antenna coupler is independent of RF power variation since the two power transfers are normalized voltage samples and no adjustment or power level setting is required for the proper coupler operation.

Many advantages of the present invention may be ascertained from a reading of the specification and claims in conjunction with the drawings.

DETAILED DESCRIPTION OF THE PREFERRED EMBODIMENT

Figure 1:
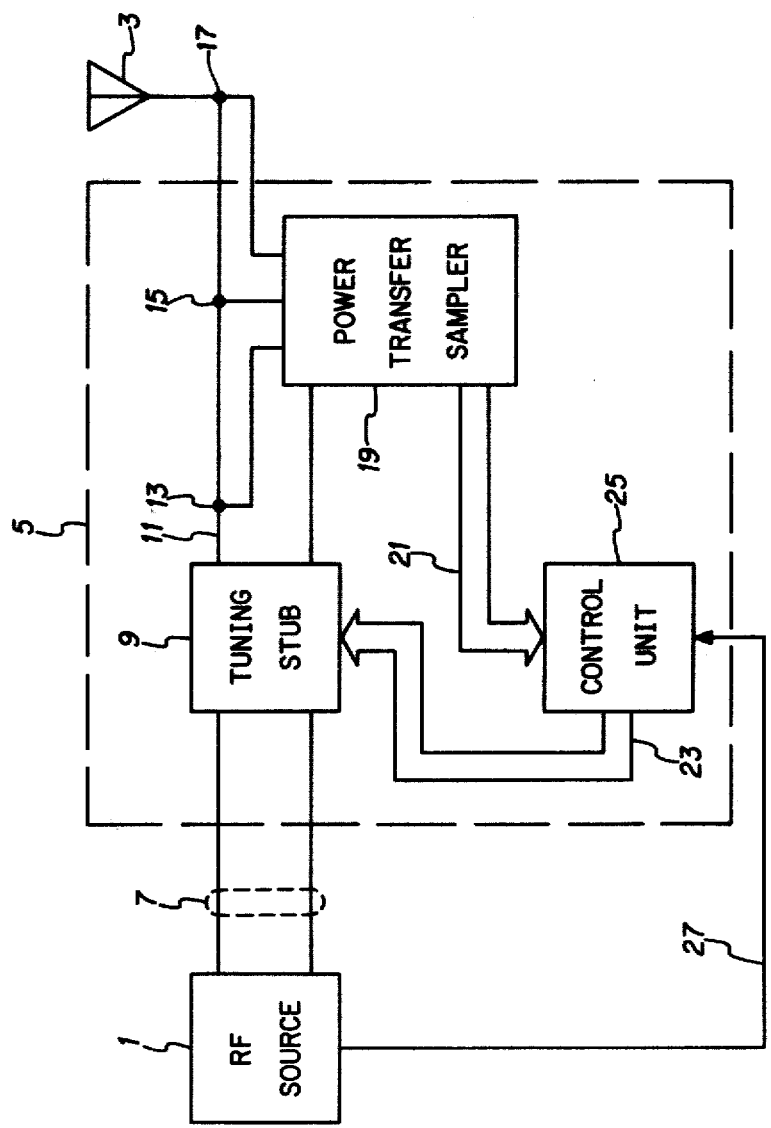
FIG. 1 is a block diagram of a radio frequency transmitter system that has the antenna coupler inserted between the radio frequency source and the antenna according to the invention.

In FIG. 1 there is shown a radio frequency (RF) source 1 such as a radio transmitter that is used to drive a load represented by antenna 3. Inserted between the RF source 1 and the antenna 3 is an antenna coupler 5 that is used to match the impedance of the transmission lines represented by conductor pair 7 and the antenna 3. The antenna coupler 5 measures the power transferred between the load at load point 17 from a second point 15 that is located a preselected physical distance $\alpha$ from the load as well as the power transfer between a third point 13 that is located a physical distance of $2\alpha$ from the load point 17 on the antenna conductor 11. The power transfer sampler 19 provides the power transfer by means of conductor bundle 21 to the control unit 25 which selects the tuning stub length and decodes this information for application to the tuning stub 9 by means of conductor bundle 23. In addition the RF source 1 provides a signal representative of the operating frequency of the transmitter to the control unit 25 via conductor 27. This operating frequency in conjunction with the known physical length $\alpha$ between points 13 and 15 or points 15 and 17 determines the angle $\theta$, where $\theta$ is the distance from the load in wavelength of the operation frequency.

Figure 2:
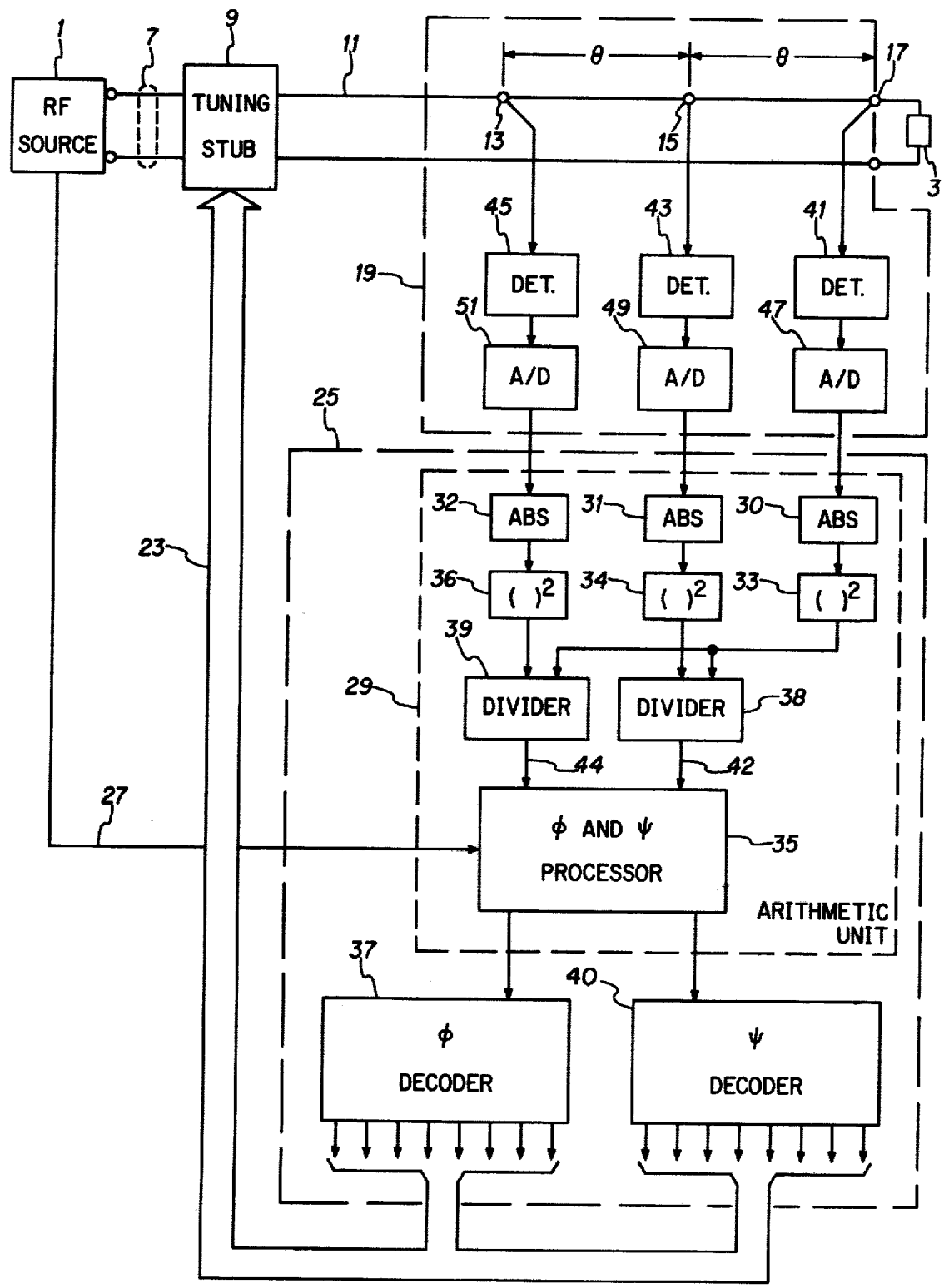
FIG. 2 is a simplified block diagram of the power transfer sampler and control unit of the antenna coupler of FIG. 1.

In FIG. 2 there is shown a more detailed block diagram of the power transfer sampler 19 and the control unit 25. The power transfer is measured as mentioned earlier at 3 points. Load point 17 which is located at the load or antenna 3, second point 15 which is measured at a distance of $\theta$ from load point 17 and a third point 13 which is measured at a distance of $\theta$ from second point 15. In the preferred embodiment only the potential of the signal at load point 17, $E_r$, is measured and the ratio of the absolute value squared of the potential measured at load point 17 to the absolute value squared of the potential $E_{s1}$ measured at the second point 15 provides the power transfer between the second point 15 and the load point 17. The equation $$U_1 = \frac{|E_{s1}|^2}{|E_r|^2}$$

provides this relationship. Similarly, only the potential $E_{s2}$ is measured at the third point 13 and the ratio of the power transfer, $U_2$ between the third point 13 and the load point 17 is equal to the ratio of $$U_2 = \frac{|E_{s2}|^2}{|E_r|^2}.$$

Although there are numerous analog and digital methods of obtaining the ratios represented by $$U_1 = \frac{|E_{s1}|^2}{|E_r|^2} \text{ and } U_2 = \frac{|E_{s2}|^2}{|E_r|^2},$$

in the preferred embodiment because of the necessity of high speeds the digital method is utilized. This is accomplished by detecting the potential $E_r$ at load point 17 by a detector 41 and applying the detected potential to an A/D converter 47 for conversion to a binary or digital signal. Similarly the potential $E_{s1}$ is detected at the second point 15 by detector 43 and converted into a binary or digital signal by an A/D converter 49, and likewise the potential $E_{s2}$ at the third point 13 is detected by the detector 45 and converted to a digital or binary signal by analog to digital converter 51. The digital representations of $E_{s1}$, $E_{s2}$ and $E_r$ are applied to the control unit 25 which includes an arithmetic unit 29. If the power transfer values $U_1$ and $U_2$ are calculated rather than measured directly and in the case, as in the preferred embodiment where the detected potentials $E_{s1}$, $E_{s2}$, and $E_r$ are converted to digital values, then the outputs of the analog-to-digital converters 47, 49 and 51 are applied to digital absolute value devices 30, 31 and 32 which take the absolute value of $E_r$, $E_{s1}$, and $E_{s2}$ respectively. The absolute values of the measured potentials are then squared by squaring devices 33, 34 and 36. $U_1$ is determined by dividing the absolute value of $E_r^2$ into the absolute value of $E_{s1}^2$ and this division is performed by the digital divider 38. Similarly $U_2$ is the output of the digital divider 39 and is the value obtained by dividing the absolute value of $E_r^2$ into the absolute value of $E_{s2}^2$. The equations for $U_1$ and $U_2$ are $$U_1 = \frac{|E_{s1}|^2}{|E_r|^2} \text{ and } U_2 = \frac{|E_{s2}|^2}{|E_r|^2}.$$

$U_1$ is present on conductor 42, and $U_2$ is present on conductor 44. Given the value of $U_2$ and $U_1$, as well as the operating frequency that is provided from the RF source by conductor 27, the $\Phi$ and $\Psi$ processor 35, which in the case of the preferred embodiment is a ROM that has stored therein the corresponding values of $\Phi$ and $\Psi$ giving the operating frequencies and the values of the power transfers $U_1$ and $U_2$, selects the tuning stub length $\Psi$ and its location $\Phi$ and applies it to the Φ decoder 37 and Ψ decoder 40. The output of the Φ and Ψ decoders 37 and 40 is applied to conductor bundle 23 for energizing the appropriate tuning stub which in the case of the preferred embodiment is lumped elements at the appropriate location.

Although the preferred embodiment is shown implementing the invention by known digital parts, an alternative means for implementing the arithmetic unit 29 is through the use of a microprocessor which operates in a similar manner. The detector 41 measures the potential $E_r$ while $E_{s1}$ and $E_{s2}$ are measured by detectors 43 and 45 respectively. The analog values for the potentials is converted to a digital signal by the A/D converters 47, 49 and 51 respectively. Arithmetic unit 29 converts the measured potentials $E_r$, $E_{s1}$ and $E_{s2}$ to the power transfer ratios $U_1$ and $U_2$. Given the power transfer ratio $U_1$ and $U_2$ and the output impedance of the RF source 1 and the length $\alpha$ which is the distance from the load point 17 to the second point 15 and from the second point 15 to the load point 13, and the operating frequency as provided by the RF source 1 then the value of the reactance of the transmission line and load may be determined by $$X = \frac{Z_0}{2} \cdot \frac{\sin\theta}{\cos\theta} \cdot \frac{U_2 + 4\cos^2\theta - 4U_1\cos^2\theta - 1}{U_2 + 2\cos^2\theta - 4U_1\cos^2\theta + 2U_1 - 1}$$

where the angle $\theta$ is determined by the operating frequency and the physical separation $\alpha$, and is the distance between the two points on wavelength angle.

The resistance part of the impedance of the transmission line 7 and load 3 is indicated by R and given the values for $U_1$, $U_2$, $Z_0$, and $\theta$. R may be calculated by the equation:

$$R = \sqrt{-X^2 + \frac{2XZ_0\sin\theta\cos\theta + Z_0^2\sin^2\theta}{U_1 - \cos^2\theta}}$$

$$X_0 = Z_0\sqrt{\frac{RZ_0}{X^2 + (R - Z_0)^2}}$$

represents the reactance part of the characteristics of the output impedance $Z_0$ of the RF source 1.

$$\Psi = \operatorname{Arctan}\sqrt{\frac{RZ_0}{X^2 + (R - Z_0)^2}}$$

is the equation for determining the stub length $\Psi$ and $$-\phi = \operatorname{Arctan}\frac{\frac{X}{Z_0} + \frac{R}{X_0}}{\frac{R}{Z_0} - 1}$$

is the equation for determining the location $\phi$ of the tuning stub. All of the above equations may be implemented by discrete digital components; precalculations and using the $\phi$ and $\Psi$ processor 35 as a lookup table, or by calculations through the use of a microprocessor for the arithmetic unit 29.

Figure 3:
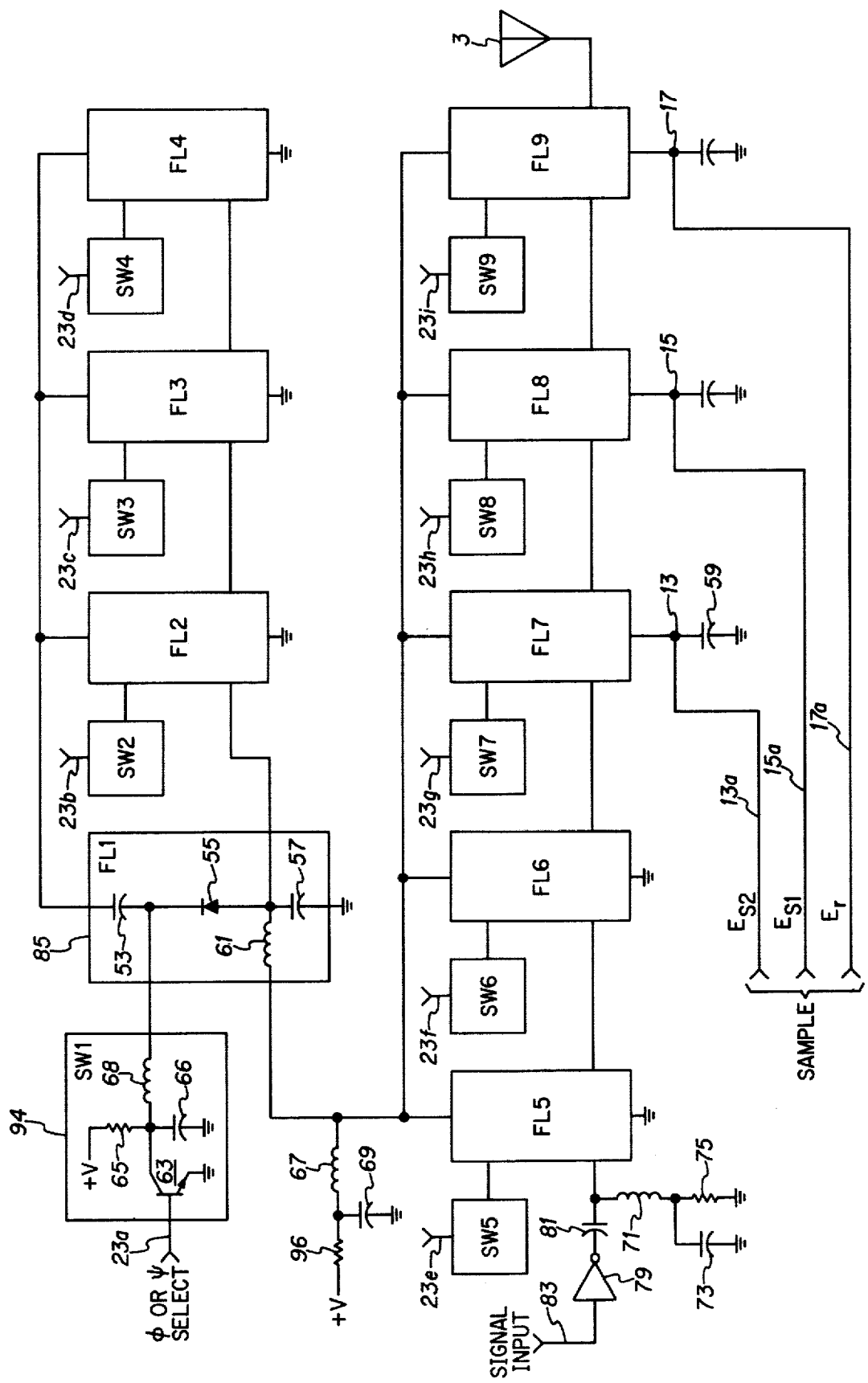
FIG. 3 is a schematic diagram of the tuning stub and power sampler of the antenna coupler of FIG. 1.

FIG. 3 is a schematic diagram of the tuning stub 9 and shows its location in the circuit that includes the antenna 3 and the sample points the third point 13, the second point 15 and the load point 17 and provides for coupling the output from the RF source 1 and which is indicated by the RF power amplifier 79 to the antenna 3 which passes through the tuning stub. The tuning stub is divided into 9 filter and switch sections FL1 through FL9 and SW1 through SW9 with filter sections FL5, FL6, FL7, FL8 and FL9 selecting the location of the tuning stub and sections FL1, FL2, FL3 and FL4 determining the length of the tuning stub. Each section of the tuning stub comprises a capacitor 53, a pin diode 55, a capacitor 57 which is connected to the referenced potential, an inductor 61 and a switch assembly 94. Conductors 13a, 15a, and 17a are connected to points 13, 15 and 17. The sample points 13, 15 and 17 are isolated from the reference potential by a capacitor 59. Each section is energized by a switch assembly 94 and in the case of the preferred embodiments there are 9 switches SW1 through SW9. Each switch consists of a transistor 63, a resistor 65 connected to a DC potential (not shown), an inductor 68 and a capacitor 66. The resistor 65 is for biasing the inductor 68 and capacitor 66 are for filtering. The outputs from the Ψ and φ decoders 37 and 40 are brought in to the switch assembly 94 by means of the conductor bundle 23 with each conductor 23a through 23i going to a preselected switch. Upon the proper value of φ being selected, one of the 5 switches SW5 through SW9 will be energizing and placing the tuning stub at the appropriate location on the transmission line which is a portion of the transmission conductor pair 7. The length of the tuning stub Ψ is selected by the decoder 40 energizing one of the 4 switches either SW1, SW2, SW3 and SW4 and placing the lumped elements across the transmission line. In this way, through a dynamic feedback loop, the transmission line may be compensated to ensure the proper transfer from the power amplifier 79 to the antenna 3. Inductors 67 and 71, as well as resistors 75 and 96 and capacitors 73 and 69 are used for filtering of the bias supplies for the pin diode 55. Capacitor 81 is a DC blocking capacitor to prevent DC feedback into the RF amplifier 79 and connector 83 connects the tuning stub 9 to the remainder of the RF signal source.

Many changes and modifications in the above described embodiment of the invention can, of course, be carried out without departing from the scope thereof. Accordingly, to promote the progress and science in useful arts, the invention is disclosed and is intended to be limited only by the scope of the appended claims.

I claim:

1. A high speed coupler for tuning a transmission line between a radio frequency source having an output impedance $Z_0$ and a radio frequency load, comprising:
    means for measuring the power transfer $U_1$ between a point located a distance $\theta$, where $\theta$ is the distance in wavelength of the transmitted frequency, from the RF load;
    means for measuring the power transfer $U_2$ between a point located a distance of $2\theta$ from the RF load; and
    means for inserting a tuning stub having a length $\Psi$ and located a distance $\phi$ from the RF load wherein $\Psi$ and $\Phi$ are indicated by $U_1$, $U_2$, $\theta$ and $Z_0$.

2. The high speed coupler according to claim 1 wherein the means for measuring $U_1$ and the means for measuring $U_2$, comprises:
    means for measuring the voltage potential $E_r$ at the load;

means for measuring the voltage potential $E_{s1}$ at location $\theta$;

means for measuring the voltage potential $E_{s2}$ at location $2\theta$;

means for obtaining the absolute value of $E_r$, $E_{s1}$ and $E_{s2}$;

means for squaring the absolute value of $E_r$, $E_{s1}$ and $E_{s2}$; and means for dividing the absolute value of $E_r$ into $E_{s1}$ to obtain, thereby, $U_1$ and means for dividing $E_r$ into $E_{s2}$ to obtain, thereby, $U_2$.

3. The high speed coupler according to claim 2 wherein the means for inserting a tuning stub having a length $\Psi$ and located a distance $\phi$ from the RF load comprises:

means for converting $U_1$, $U_2$, $\theta$ and $Z_0$ into a tuning stub having a length $\Psi$ and located at a distance $\phi$ from the RF load.

4. A high speed method for tuning a transmission line between a radio frequency source having an output impedance $Z_0$ and a radio frequency load, comprising:

measuring the power transfer $U_1$ between a point located a distance $\theta$ where $\theta$ is the distance in wavelength of the transmitted frequency from the RF load;

measuring the power transfer $U_2$ between a point located a distance of $2\theta$ from the RF load; and inserting a tuning stub having a length $\Psi$ and located a distance $\phi$ from the RF load wherein $\Psi$ and $\Phi$ are indicated by $U_1$, $U_2$, $\theta$ and $Z_0$.

5. The high speed method according to claim 4 wherein the step for measuring $U_1$ and the means for measuring $U_2$, comprises:

measuring the voltage potential $E_r$ at the load;

measuring the voltage potential $E_{s1}$ at location $\theta$;

measuring the voltage potential $E_{s2}$ at location $2\theta$;

obtaining the absolute value of $E_r$, $E_{s1}$ and $E_{s2}$;

means for squaring the absolute value of $E_r$, $E_{s1}$ and $E_{s2}$; and dividing the absolute value of $E_r$ into $E_{s1}$ to obtain, thereby, $U_1$ and means for dividing $E_r$ into $E_{s2}$ to obtain, thereby, $U_2$.

6. The high speed method according to claim 2 wherein the step for inserting a tuning stub having a length $\Psi$ and located a distance $\phi$ from the RF load comprises:

converting $U_1$, $U_2$, $\theta$ and $Z_0$ into a tuning stub having a length $\Psi$ and located at a distance $\phi$ from the RF load.

* * * * *